(12) United States Patent
Zheng

(10) Patent No.: US 11,264,579 B2
(45) Date of Patent: Mar. 1, 2022

(54) FLEXIBLE DISPLAY PANEL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Ying Zheng, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 59 days.

(21) Appl. No.: 16/763,240

(22) PCT Filed: Nov. 1, 2019

(86) PCT No.: PCT/CN2019/115041
§ 371 (c)(1),
(2) Date: May 12, 2020

(87) PCT Pub. No.: WO2021/042478
PCT Pub. Date: Mar. 11, 2021

(65) Prior Publication Data
US 2021/0074935 A1    Mar. 11, 2021

(30) Foreign Application Priority Data
Sep. 5, 2019 (CN) .................. 201910836938.X

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01); *H01L 2227/326* (2013.01)

(58) Field of Classification Search
None
See application file for complete search history.

(56) References Cited

U.S. PATENT DOCUMENTS

| 9,997,730 B2* | 6/2018 | Nishimura | H01L 51/5203 |
| 10,541,380 B1* | 1/2020 | Sung | H01L 51/0097 |
| 10,615,366 B2* | 4/2020 | Han | H01L 27/3244 |

(Continued)

FOREIGN PATENT DOCUMENTS

| CN | 108807192 A | 11/2018 |
| CN | 109037472 A | 12/2018 |

(Continued)

*Primary Examiner* — J. E. Schoenholtz
(74) *Attorney, Agent, or Firm* — The Roy Gross Law Firm, LLC; Roy Gross

(57) ABSTRACT

In a flexible display panel and a preparation method thereof provided by the present application, the flexible display panel includes a flexible substrate including a display area and a non-display area connected to each other, a thickness of the flexible substrate in the non-display area is less than a thickness of the flexible substrate in the display area; a thin film transistor layer disposed on one side of the flexible substrate; and an organic light-emitting layer disposed on one side of the thin film transistor layer away from the flexible substrate.

15 Claims, 6 Drawing Sheets

(56) References Cited

U.S. PATENT DOCUMENTS

2016/0323993 A1* 11/2016 Kwon ............... G02F 1/133305
2018/0138431 A1*  5/2018 Nishimura .......... H01L 51/0097
2020/0028101 A1   1/2020 Cao et al.
2020/0119110 A1   4/2020 Chen et al.
2021/0226139 A1*  7/2021 Cao .................... H01L 51/0034

FOREIGN PATENT DOCUMENTS

| CN | 109494315 A | 3/2019 |
| CN | 109560088 A | 4/2019 |

* cited by examiner

Providing a photomask comprising a light-shielding area and a light-transmission area connected to each other, an orthographic projection of the light-shielding area on the carrier substrate coincides with the display area on the carrier substrate, an orthographic projection of the light-transmission area on the carrier substrate coincides with the non-display area on the carrier substrate; — 1031 irradiating the bonding sub-layer corresponding to the non-display area with ultraviolet light by using the photomask as a mask to reduce the adhesion of the bonding sub-layer corresponding to the non-display area; — 1032 forming a second organic sub-layer on the bonding sub-layer. — 1033

FIG. 2

FLEXIBLE DISPLAY PANEL AND PREPARATION METHOD THEREOF

FIELD OF INVENTION

The present application relates to a field of display, and in particular to a flexible display panel and a method of preparing the same.

BACKGROUND OF INVENTION

At present, displayers are developing in a direction of being more convenient, more fashionable, and more environmentally friendly. Flexible displays, such as flexible active-matrix organic light-emitting diodes, have advantages of self-luminosity, fast response times, high brightness, and wide viewing angles, etc. which can be curled and folded. Compared with traditional hard-screen displayers, the flexible displayers have advantages of lightweight and small volume and are convenient to carry, thereby have a very broad application prospect.

Technical Problem

In recent years, a substrate structure commonly used in the flexible display panels is a two-layer structure mainly composed of polyimide, compared with a single-layer polyimide flexible substrate, the two-layer structure has better reliability. However, when bending, due to presence of a large amount of organic layers and metal wires on the non-display area of the flexible substrate, the reduction of bending radius causes a large concentration of stress, which makes the organic film layer of the flexible display panel to crack and makes the metal wires to break, resulting in an electrical signal in the display panel not being smoothly transmitted.

Therefore, how to improve the bending resistance of the flexible display panels on the premise of ensuring reliability is the goal of panel manufacturers all over the world.

SUMMARY OF INVENTION

The present application provides a flexible display panel and a preparation method thereof, which can improve the bending resistance of a flexible display panel on the premise of ensuring the reliability of the flexible display panel.

The application provides a flexible display panel, the flexible display panel includes:
  a flexible substrate including a display area and a non-display area connected to each other, a thickness of the flexible substrate in the non-display area is less than a thickness of the flexible substrate in the display area, the flexible substrate includes a first organic sub-layer, an intermediate layer, a bonding sub-layer, and a second organic sub-layer which are sequentially stacked, the first organic sub-layer, the intermediate layer, and the bonding sub-layer are disposed corresponding to the display area, and the second organic sub-layer is disposed corresponding to the display area and the non-display area;
  a thin film transistor layer disposed on one side of the flexible substrate, and the thin film transistor layer disposed on one side of the second organic sub-layer, the thin film transistor layer includes an array sub-layer and a wiring sub-layer, the array sub-layer is disposed corresponding to the display area and the wiring sub-layer is disposed corresponding to the non-display area;
  an organic light-emitting layer disposed on one side of the thin film transistor layer away from the flexible substrate and disposed corresponding to the display area; and
  an encapsulation layer disposed on one side of the organic light-emitting layer away from the thin film transistor layer and extending to cover the non-display area of the flexible substrate.

In the flexible display panel provided by the present application, a thickness of the first organic sub-layer is greater than or equal to a thickness of the second organic sub-layer.

In the flexible display panel provided by the present application, the first organic sub-layer and the second organic sub-layer are made of polyimide.

In the flexible display panel provided by the present application, the intermediate layer is made of any of silicon oxide, aluminum oxide, and silicon nitride or a combination thereof.

In the flexible display panel provided by the present application, the bonding sub-layer is made of a silane coupling agent.

The application also provides a flexible display panel including:
  a flexible substrate including a display area and a non-display area connected to each other, a thickness of the flexible substrate in the non-display area is less than a thickness of the flexible substrate in the display area;
  a thin film transistor layer disposed on one side of the flexible substrate;
  an organic light-emitting layer disposed on one side of the thin film transistor layer away from the flexible substrate and disposed corresponding to the display area; and
  an encapsulation layer disposed on one side of the organic light-emitting layer away from the thin film transistor layer and extending to cover the non-display area of the flexible substrate.

In the flexible display panel provided by the present application, the flexible substrate includes a first organic sub-layer, an intermediate layer, a bonding sub-layer and a second organic sub-layer which are sequentially stacked, and
  the thin film transistor layer is disposed on one side of the second organic sub-layer; and
  the first organic sub-layer, the intermediate layer, and the bonding sub-layer are disposed corresponding to the display area, and the second organic sub-layer is disposed corresponding to the display area and the non-display area.

In the flexible display panel provided by the present application, a thickness of the first organic sub-layer is greater than or equal to a thickness of the second organic sub-layer.

In the flexible display panel provided by the present application, the first organic sub-layer and the second organic sub-layer are made of polyimide.

In the flexible display panel provided by the present application, the bonding sub-layer is made of a silane coupling agent.

In the flexible display panel provided by the present application, the intermediate layer is made of any of silicon oxide, aluminum oxide, and silicon nitride or a combination thereof.

In the flexible display panel provided by the present application, the thin film transistor layer includes an array sub-layer and a wiring sub-layer, and the array sub-layer is disposed corresponding to the display area, and the wiring sub-layer is disposed corresponding to the non-display area.

The present application also provides a method for preparing a flexible display panel, the preparation method includes:

providing a carrier substrate including a display area and a non-display area connected to each other;

forming a first organic sub-layer, an intermediate layer, and a bonding sub-layer on the carrier substrate;

irradiating the bonding sub-layer corresponding to the non-display area to weaken an adhesion of the bonding sub-layer corresponding to the non-display area and forming a second organic sub-layer on the bonding sub-layer; and removing the carrier substrate, and separating the second organic sub-layer corresponding to the non-display area from the first organic sub-layer, the intermediate layer, and the bonding sub-layer.

In the method for preparing a flexible display panel provided by the present application, the step of irradiating the bonding sub-layer corresponding to the non-display area to weaken the adhesion of the bonding sub-layer corresponding to the non-display area and forming the second organic sub-layer on the bonding sub-layer, including:

providing a photomask including a light-shielding area and a light-transmission area connected to each other, an orthographic projection of the light-shielding area on the carrier substrate coincides with the display area on the carrier substrate, an orthographic projection of the light-transmission area on the carrier substrate coincides with the non-display area on the carrier substrate;

irradiating the bonding sub-layer corresponding to the non-display area with ultraviolet light by using the photomask as a mask to reduce the adhesion of the bonding sub-layer corresponding to the non-display area.

In the method for preparing a flexible display panel provided by the present application, the step of separating the second organic sub-layer corresponding to the non-display area from the first organic sub-layer, the intermediate layer, and the bonding sub-layer, including:

processing the first organic sub-layer, the intermediate layer, and the bonding sub-layer corresponding to the non-display area by laser cutting to form a predetermined cutting trajectory; and separating the second organic sub-layer corresponding to the non-display area from the first organic sub-layer, the intermediate layer, and the bonding sub-layer by mechanical stripping.

In the method for preparing a flexible display panel provided by the present application, the predetermined cutting trajectory is from two ends of the first organic sub-layer corresponding to the non-display area to a surface of a side of the second organic sub-layer adjacent to the first organic sub-layer.

Beneficial Effect

In the flexible display panel and the preparation method thereof provided by the present application, by changing the non-display area of the flexible display panel into a single-layer organic layer structure, a thickness of the film layer in the non-display area of the flexible display panel becomes thinner. When bending, the non-display area of the flexible display panel does not cause a large concentration of stress, and the flexible display panel does not suffer from breakages of the organic layer and the metal wires, while the display area of the flexible display panel is still a two-layer organic layer structure i.e. has a thicker film layer so that the flexible display panel has extremely high reliability. In this way, the bending resistance of the flexible display panel can be improved on the premise of ensuring the reliability of the flexible display panel.

DESCRIPTION OF DRAWINGS

In order to more clearly illustrate the technical solutions in the present application, the drawings to be used in the description of the embodiments will be briefly described below. Obviously, the drawings in the description are only some embodiments of the present application, and those skilled in the art can obtain other drawings according to the drawings without doing any creative activity.

FIG. 2 is a first sub-flow diagram of a method for preparing a flexible display panel according to an embodiment of the present application.

DETAILED DESCRIPTION OF PREFERRED EMBODIMENTS

The technical solutions in the present application will be clearly and completely described in the following with reference to the accompanying drawings in the embodiments of the present application. It is obvious that the described embodiments are only a part of the embodiments of the present application, and not all of them. All other embodiments obtained by a person skilled in the art based on the embodiments in the present application without creative efforts are within the scope of the present application.

Figure 1:
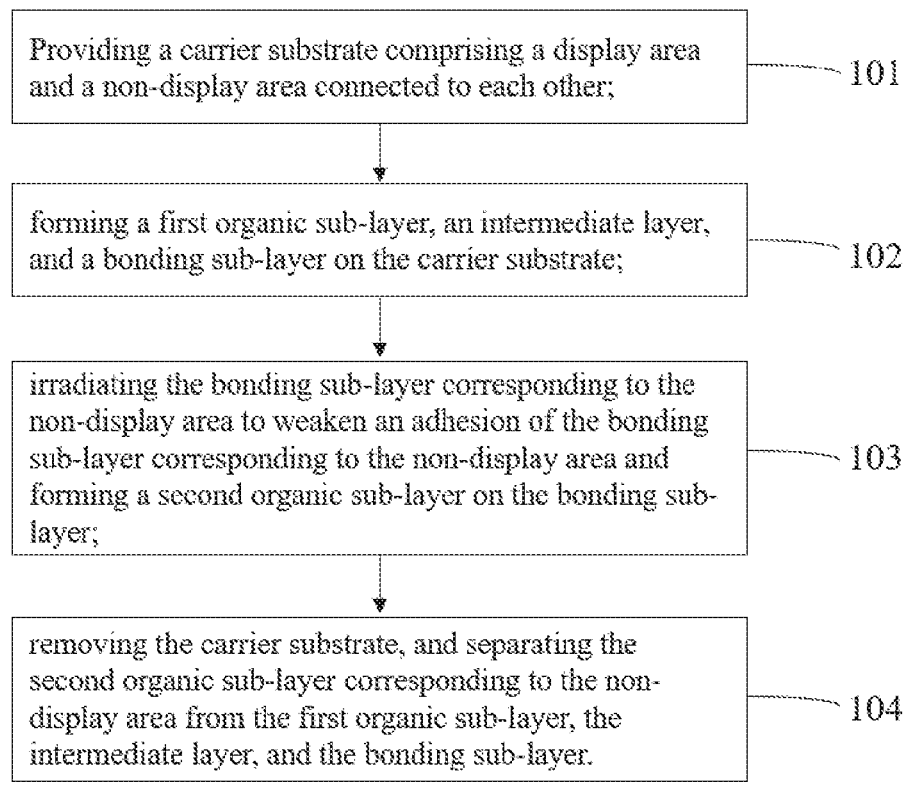
FIG. 1 is a schematic flow chart of a method for preparing a flexible display panel according to an embodiment of the present application.

Please refer to FIG. 1, which is a schematic flowchart of a method for preparing a flexible display panel according to an embodiment of the present application. As shown in FIG. 1, a method for preparing a flexible display panel provided by an embodiment of the present application includes the following steps: 101, providing a carrier substrate, the carrier substrate includes a display area and a non-display area connected to each other; 102, sequentially forming a first organic sub-layer, an intermediate layer, and a bonding sub-layer on the carrier substrate; 103, irradiating the bonding sub-layer corresponding to the non-display area to weaken an adhesion of the bonding sub-layer corresponding to the non-display area and forming a second organic sub-layer on the bonding sub-layer; and 104, removing the carrier substrate and separating the second organic sub-layer corresponding to the non-display area from the first organic sub-layer, the intermediate layer, and the bonding sub-layer.

It can be understood that, in the present solution, by changing the non-display area of the flexible display panel into a single-layer organic layer structure, the thickness of the film layer in the non-display area of the flexible display panel becomes thinner. When bending, the non-display area of the flexible display panel does not cause a large concentration of stress, and the flexible display panel does not suffer from breakages of the organic layer and the metal wire, and the display area of the flexible display panel is still a two-layer organic layer structure i.e. has a thicker film layer so that the flexible display panel has extremely high reliability. In this way, the bending resistance of the flexible display panel can be improved on the premise of ensuring the reliability of the flexible display panel.

Specifically, please refer to FIG. 1 and FIG. 2, FIG. 2 is a schematic diagram of a first sub-flow of a method for preparing a flexible display panel according to an embodiment of the present application. As shown in FIG. 1 and FIG. 2, step 103 specifically includes: 1031, providing a photomask, the photomask includes a light-shielding area and a light-transmission area connected to each other, an orthographic projection of the light-shielding area on the carrier substrate coincides with the display area on the carrier substrate, and an orthographic projection of the light-transmission area on the carrier substrate coincides with the non-display area on the carrier substrate; 1032, using the photomask to irradiate the bonding sub-layer corresponding to the non-display area with ultraviolet light to reduce the adhesion of the bonding sub-layer corresponding to the non-display area; and 1033, and forming a second organic sub-layer on the bonding sub-layer.

Wherein, in one embodiment, a manner of forming the bonding sub-layer includes one or a combination of spraying and coating.

In addition, it can be understood that the material of the bonding sub-layer is a silane coupling agent, and the adhesion of the silane coupling agent is reduced after ultraviolet light irradiation. Therefore, ultraviolet irradiation of the bonding layer positioned in the non-display area ensures that the bonding layer of the non-display area and the second organic sub-layer are easily separated, and the non-display area becomes a single organic layer structure.

In addition, it can be understood that when the bonding sub-layer is subjected to irradiation treatment, a photomask is used as a mask, an orthographic projection of the light-shielding area of the photomask on the carrier substrate coincides with the display area on the carrier substrate, and an orthographic projection of the light-transmission area of the photomask on the carrier substrate coincides with the non-display area on the carrier substrate. Therefore, when performing ultraviolet light irradiation, the ultraviolet light will only irradiate the bonding layer positioned in the non-display area without irradiating the bonding layer positioned in the display area. This does not reduce the adhesion of the bonding layer in the display area, resulting in a separation of the bonding sub-layer positioned in the display area from the second organic sub-layer.

Figure 3:
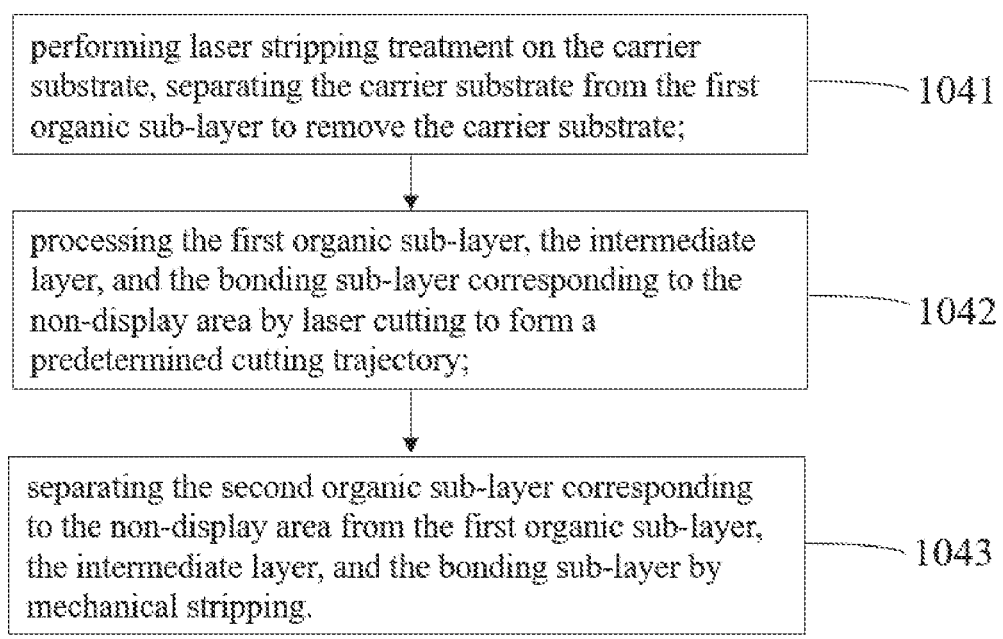
FIG. 3 is a second sub-flow diagram of a method for preparing a flexible display panel according to an embodiment of the present application.

Specifically, please refer to FIG. 1 and FIG. 3, FIG. 3 is a second sub-flow diagram of a method for preparing a flexible display panel according to an embodiment of the present application. As shown in FIG. 1 and FIG. 3, step 104 specifically includes: 1041, performing laser stripping treatment on the carrier substrate, separating the carrier substrate from the first organic sub-layer to remove the carrier substrate; 1042, processing the first organic sub-layer, the intermediate layer, and the bonding sub-layer corresponding to the non-display area by laser cutting to form a predetermined cutting trajectory; and 1043, separating the second organic sub-layer corresponding to the non-display area from the first organic sub-layer, the intermediate layer, and the bonding sub-layer by mechanical stripping.

It can be understood that the laser stripping is to separate the carrier substrate from the first organic sub-layer by utilizing the difference in laser absorbability between the carrier substrate and the first organic sub-layer. Specifically, after projecting laser light onto the carrier substrate, the laser light passes through the carrier substrate and is absorbed by the buffer layer at the junction of the carrier substrate and the first organic sub-layer. The produced confined plasma then strips the carrier substrate from the first organic sub-layer, thereby removing the carrier substrate.

Wherein, in one embodiment, the predetermined cutting trajectory starts cutting from both ends of the first organic sub-layer corresponding to the non-display area, to a surface of the second organic layer adjacent to one side of the first organic sub-layer.

Wherein, in one embodiment, the preset cutting trajectory is to start cutting from both ends of the first organic sub-layer corresponding to the non-display area to a surface of the first organic sub-layer adjacent to a side of the second organic sub-layer.

It can be understood that whether cutting to a surface of the second organic sub-layer adjacent to one side of the first organic sub-layer or cutting to a surface of the first organic sub-layer adjacent to one side of the second organic sub-layer, a second organic sub-layer and a bonding sub-layer positioned in the bending area are connected to each other by an adhesion force between the second organic sub-layer and the bonding sub-layer and the bonding layer corresponding to the non-display area is previously subjected to irradiation treatment, which weakens the adhesion of the bonding sub-layer corresponding to the non-display area. Therefore, the first organic sub-layer, the intermediate layer and the bonding sub-layer corresponding to the non-display area are easily separated from the second inorganic sub-layer, such that the non-display area is changed into a single-layer organic layer structure, the bending resistance of the flexible display panel is improved, and the laser cutting is performed only for the purpose of facilitating longitudinal separation of the bonding sub-area corresponding to the non-display area.

Figure 4:
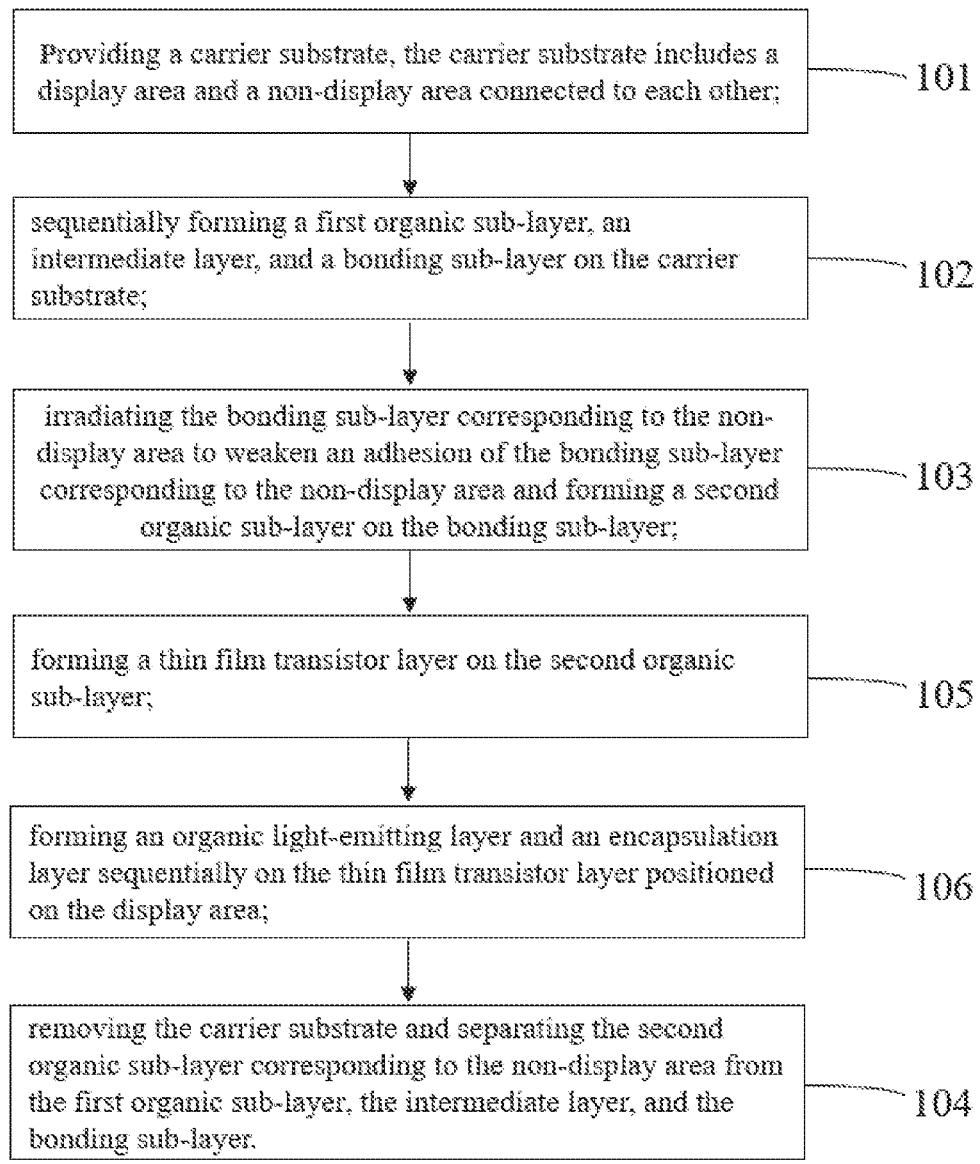
FIG. 4 is another schematic flowchart of a method for preparing a flexible display panel according to an embodiment of the present application.

Further, please refer to FIG. 4, FIG. 4 is another schematic flowchart of a method for preparing a flexible display panel according to an embodiment of the present application. The method for preparing the flexible display panel shown in FIG. 4 is different from that in FIG. 1. The method for preparing the flexible display panel shown in FIG. 4 further includes the following steps after step 103: step 105, forming a thin film transistor layer on the second organic sub-layer; and step 106, forming an organic light-emitting layer and an encapsulation layer sequentially on the thin film transistor layer positioned on the display area. In the preparation method of the flexible display panel provided by the present application, by changing the non-display area of the flexible display panel into a single-layer organic layer structure, a thickness of the film layer in the non-display area of the flexible display panel becomes thinner. When bending, the non-display area of the flexible display panel does not cause a large concentration of stress, and the flexible display panel does not suffer from breakages of the organic layer and the metal wires, and the display area of the flexible display panel is still a two-layer organic layer structure i.e. has a thicker film layer so that the flexible display panel has extremely high reliability. In this way, the bending resistance of the flexible display panel can be improved on the premise of ensuring the reliability of the flexible display panel.

Figure 5:
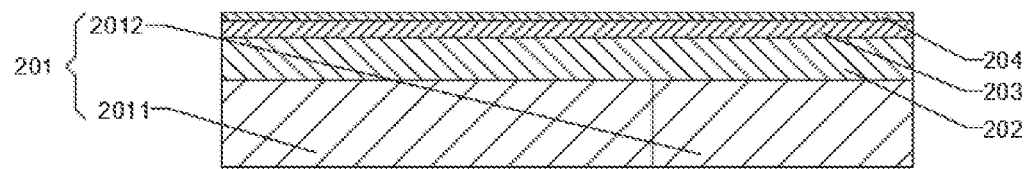
FIG. 5 is a schematic view showing a structure of a silane coupling agent layer formed in the present embodiment.

In actual operation, providing a carrier substrate 201, and the carrier substrate 201 includes a display area 2011 and a non-display area 2012 connected to each other. Forming a first organic sub-layer 202 on the carrier substrate 201 by a coating process, a thickness of the first organic sub-layer 202 is 6-10 μm, covering the first organic sub-layer 202 with an intermediate layer 203 by chemical deposition or the like, a thickness of the intermediate layer is 500 nm, and spraying or coating a silane coupling agent on the intermediate layer 203 to form a silane coupling agent layer 204 having a thickness of about 50 nm. The formed structure is as shown in FIG. 5, and FIG. 5 is a schematic structural view of the silane coupling agent layer formed in the embodiment of the present application.

Figure 6:
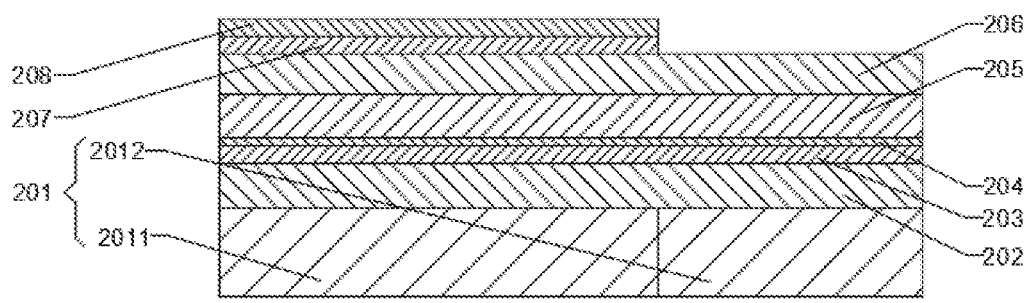
FIG. 6 is a schematic structural view of forming an organic light-emitting layer and an encapsulation layer according to an embodiment of the present application.

Next, providing a photomask, the photomask includes a light-shielding area and a light-transmission area connected to each other. An orthographic projection of the light-shielding area on the carrier substrate 201 coincides with the display area 2011 on the carrier substrate 201, and an orthographic projection of the light-transmission area on the carrier substrate 201 coincides with the non-display area 2022 on the carrier substrate 201. Irradiating the silane coupling agent layer 204 positioned in the non-display area 2022 with ultraviolet light by using a photomask as a mask, and forming a second organic sub-layer 205 on the silane coupling agent layer 204 by coating, a thickness of the second organic sub-layer 205 is 6-10 μm, and the second organic sub-layer 205 has a thickness greater than or equal to the thickness of the first organic sub-layer 202. Forming a thin film transistor layer 206 on the second organic sub-layer 205, and sequentially forming an organic light-emitting layer 207 and an encapsulation layer 208 on the thin film transistor layer 206 positioned in the display area 2011. The formed structure is as shown in FIG. 6. FIG. 6 is a schematic structural view of the organic light-emitting layer and the encapsulation layer formed in the embodiment of the present application.

Figure 7:
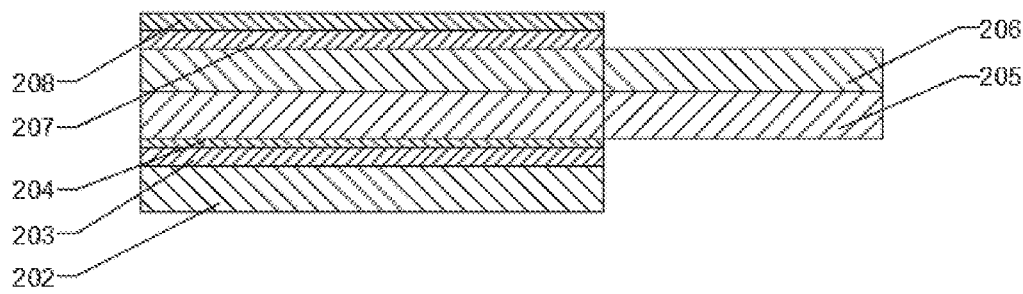
FIG. 7 is a schematic structural view of a non-display area of the present application when it becomes a single-layer organic layer structure.

Finally, separating the carrier substrate 201 and the first organic sub-layer 202 by laser stripping to remove the carrier substrate 201. Laser cutting is performed from both ends of the first organic sub-layer 202 positioned in the non-display area 202 until cutting to a surface of the first organic sub-layer 202 adjacent to a side of the second organic sub-layer 205, or until cutting to a surface of the second organic sub-layer adjacent to a side of the first organic sub-layer, then separating the second organic sub-layer 205 positioned in the non-display area 2012 from the first organic sub-layer 202, the intermediate layer 203 and the silane coupling agent layer 204 by mechanical stripping. Therefore, the non-display area 2012 is changed into a single organic layer structure, and the formed structure is as shown in FIG. 7. FIG. 7 is a schematic structural view of the non-display area of the present application when it becomes a single organic layer structure.

Figure 8:
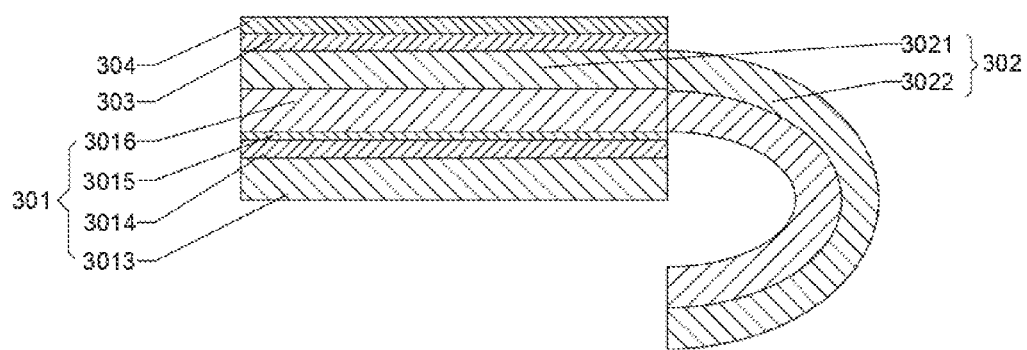
FIG. 8 is a schematic structural diagram of a flexible display panel according to an embodiment of the present application.

Referring to FIG. 8, FIG. 8 is a schematic structural diagram of a flexible display panel according to an embodiment of the present application. As shown in FIG. 8, the flexible display panel provided by the embodiment of the present application includes a flexible substrate 301, a thin film transistor layer 302, an organic light-emitting layer 303, and an encapsulation layer 304.

The flexible substrate 301 includes a display area and a non-display area connected to each other, a thickness of the flexible substrate 301 in the non-display area is less than a thickness of the flexible substrate 301 in the display area, the flexible substrate 301 includes a first organic sub-layer 3011, an intermediate layer 3012, a bonding sub-layer 3013, and a second organic sub-layer 3014 which are sequentially stacked, the first organic sub-layer 3011, the intermediate layer 3012, and the bonding sub-layer 3013 are disposed corresponding to the display area; the thin film transistor layer 302 is disposed on one side of the flexible substrate 301, the thin film transistor layer 302 includes an array sub-layer 3021 and a wiring sub-layer 3022, the array sub-layer 3021 is disposed corresponding to the display area and the wiring sub-layer 3022 is disposed corresponding to the non-display area; the organic light-emitting layer 303 is disposed on one side of the thin film transistor layer 302 away from the flexible substrate 301 and is disposed corresponding to the display area; and the encapsulation layer 304 is disposed on one side of the organic light-emitting layer 303 away from the thin film transistor layer 302 and extending to cover the non-display area of the flexible substrate 301.

In one embodiment, a thickness of the second organic sub-layer is less than or equal to a thickness of the first sub-organic layer.

It can be understood that the thickness of the second organic sub-layer less than or equal to the thickness of the first sub-organic layer can improve performances such as operating voltage and luminous efficiency of the flexible display panel.

In one embodiment, the material of the first organic sub-layer includes polyimide. The first organic sub-layer organic material has a viscosity of 3,000 to 5,000 cps. The first organic sub-layer has a thickness of 6-10 μm.

In one embodiment, the material of the second organic sub-layer includes polyimide. A thickness of the second organic sub-layer is 6-10 μm, and the thickness of the second organic sub-layer is less than or equal to a thickness of the first organic sub-layer.

In one embodiment, the material of the intermediate layer includes one or a combination of silicon oxide, aluminum oxide, and silicon nitride. The intermediate layer has a thickness of 400-600 nm, and the intermediate layer may have a thickness of 500 nm.

In one embodiment, the material of the bonding sub-layer is a silane coupling agent, the silane coupling agent includes any of a vinyl silane, an amino silane, an epoxy silane, a mercapto silane, and a methacryloxy silane or a combination thereof.

It can be understood that the silane coupling agent has two groups because of itself; one group can be combined with the skeletal material being bonded; and the other group can be combined with a polymer material or a binder to form a strong chemical bond at the bonding interface, which greatly improves the bonding strength, and thus can be used as a material for the bonding sub-layer.

It can be understood that the silane coupling agent itself has two groups; one group can be combined with the skeletal material being bonded; and the other group can be combined with a polymer material or a binder to form a strong chemical bond at the bonding interface, which greatly improves the bonding strength, and thus can be used as a material for the bonding sub-layer.

It should be noted that in the diagram of the flexible display panel of FIGS. 6, 7, and 8, the encapsulation layer not only covers the organic light-emitting layer but also extends to the non-display area and covers a part of the flexible substrate. The main function of the encapsulation layer (protecting the organic light-emitting layer) is exemplified in FIGS. 6-8; it is not intended to limit the structure of the flexible display panel of the present application.

For the specific implementation steps of the method for preparing the flexible display panel provided by the present application, please refer to the foregoing embodiments, and details are not described herein again.

It can be understood that in the flexible display panel provided by the present application, the non-display area of the flexible display panel is a single-layer organic layer structure, a thickness of the film layer in the non-display area of the flexible display panel is thinner. When bending, the non-display area of the flexible display panel does not cause a large concentration of stress, and the flexible display panel does not suffer from breakages of the organic layer and the metal wires. The display area of the flexible display panel is still a two-layer organic layer structure i.e. has a thicker film layer so that the flexible display panel has extremely high reliability. In this way, the bending resistance of the flexible display panel can be improved on the premise of ensuring the reliability of the flexible display panel.

The foregoing provides a detailed introduction to the embodiment of the present application, and the specific embodiments are applied herein to explain the principles and implementation manners of the present application. The above description of the embodiments is merely for facilitating an understanding of the present application. In the meantime, those skilled in the art will be able to change the specific embodiments and the scope of the application according to an idea of the present application. In conclusion, the content of this specification should not be construed as limiting the application.

What is claimed is:

1. A flexible display panel, comprising:
    a flexible substrate comprising a display area and a non-display area connected to each other, a thickness of the flexible substrate in the non-display area being less than a thickness of the flexible substrate in the display area, the flexible substrate comprising a first organic sub-layer, an intermediate layer, a bonding sub-layer, and a second organic sub-layer which are sequentially stacked; the first organic sub-layer, the intermediate layer, and the bonding sub-layer disposed corresponding to the display area, and the second organic sub-layer disposed corresponding to the display area and the non-display area;
    a thin film transistor layer disposed on one side of the flexible substrate, and the thin film transistor layer disposed on one side of the second organic sub-layer, the thin film transistor layer comprising an array sub-layer and a wiring sub-layer; the array sub-layer disposed corresponding to the display area and the wiring sub-layer disposed corresponding to the non-display area;
    an organic light-emitting layer disposed on one side of the thin film transistor layer away from the flexible substrate and disposed corresponding to the display area; and
    an encapsulation layer disposed on one side of the organic light-emitting layer away from the thin film transistor layer and extending to cover the non-display area of the flexible substrate.

2. The flexible display panel according to claim 1, wherein a thickness of the first organic sub-layer is greater than or equal to a thickness of the second organic sub-layer.

3. The flexible display panel according to claim 1, wherein the first organic sub-layer and the second organic sub-layer are made of polyimide.

4. The flexible display panel according to claim 1, wherein the bonding sub-layer is made of a silane coupling agent.

5. The flexible display panel according to claim 1, wherein the intermediate layer is made of any of silicon oxide, aluminum oxide, and silicon nitride or a combination thereof.

6. A flexible display panel, comprising:
    a flexible substrate comprising a display area and a non-display area connected to each other, a thickness of the flexible substrate in the non-display area being less than a thickness of the flexible substrate in the display area;
    a thin film transistor layer disposed on one side of the flexible substrate, wherein the thin film transistor layer comprises an array sub-layer and a wiring sub-layer, and the array sub-layer is disposed corresponding to the display area, and the wiring sub-layer is disposed corresponding to the non-display area;
    an organic light-emitting layer disposed on one side of the thin film transistor layer away from the flexible substrate and disposed corresponding to the display area; and
    an encapsulation layer disposed on one side of the organic light-emitting layer away from the thin film transistor layer and extending to cover the non-display area of the flexible substrate.

7. The flexible display panel according to claim 6, wherein the flexible substrate comprises a first organic sub-layer, an intermediate layer, a bonding sub-layer and a second organic sub-layer which are sequentially stacked, and the thin film transistor layer is disposed on one side of the second organic sub-layer; and the first organic sub-layer, the intermediate layer, and the bonding sub-layer are disposed corresponding to the display area, and the second organic sub-layer is disposed corresponding to the display area and the non-display area.

8. The flexible display panel according to claim 7, wherein a thickness of the first organic sub-layer is greater than or equal to a thickness of the second organic sub-layer.

9. The flexible display panel according to claim 7, wherein the first organic sub-layer and the second organic sub-layer are made of polyimide.

10. The flexible display panel according to claim 7, wherein the bonding sub-layer is made of a silane coupling agent.

11. The flexible display panel according to claim 7, wherein the intermediate layer is made of any of silicon oxide, aluminum oxide, and silicon nitride or a combination thereof.

12. A method of preparing a flexible display panel, comprising:
    providing a carrier substrate comprising a display area and a non-display area connected to each other;
    forming a first organic sub-layer, an intermediate layer, and a bonding sub-layer on the carrier substrate;
    irradiating the bonding sub-layer corresponding to the non-display area to weaken an adhesion of the bonding sub-layer corresponding to the non-display area and forming a second organic sub-layer on the bonding sub-layer; and
    removing the carrier substrate, and separating the second organic sub-layer corresponding to the non-display area from the first organic sub-layer, the intermediate layer, and the bonding sub-layer.

13. The method of preparing the flexible display panel according to claim 12, wherein the step of irradiating the bonding sub-layer corresponding to the non-display area to weaken the adhesion of the bonding sub-layer corresponding to the non-display area and forming the second organic sub-layer on the bonding sub-layer, comprising:

providing a photomask comprising a light-shielding area and a light-transmission area connected to each other, an orthographic projection of the light-shielding area on the carrier substrate coincides with the display area on the carrier substrate, an orthographic projection of the light-transmission area on the carrier substrate coincides with the non-display area on the carrier substrate;

irradiating the bonding sub-layer corresponding to the non-display area with ultraviolet light by using the photomask as a mask to reduce the adhesion of the bonding sub-layer corresponding to the non-display area.

14. The method of preparing the flexible display panel according to claim 12, wherein the step of separating the second organic sub-layer corresponding to the non-display area from the first organic sub-layer, the intermediate layer, and the bonding sub-layer, comprising:

processing the first organic sub-layer, the intermediate layer, and the bonding sub-layer corresponding to the non-display area by laser cutting to form a predetermined cutting trajectory; and separating the second organic sub-layer corresponding to the non-display area from the first organic sub-layer, the intermediate layer, and the bonding sub-layer by mechanical stripping.

15. The method of preparing the flexible display panel according to claim 14, wherein the predetermined cutting trajectory is from two ends of the first organic sub-layer corresponding to the non-display area to a surface of a side of the second organic sub-layer adjacent to the first organic sub-layer.

* * * * *